United States Patent
Banna et al.

(10) Patent No.: US 8,368,308 B2
(45) Date of Patent: Feb. 5, 2013

(54) INDUCTIVELY COUPLED PLASMA REACTOR HAVING RF PHASE CONTROL AND METHODS OF USE THEREOF

(75) Inventors: Samer Banna, San Jose, CA (US); Valentin N. Todorow, Palo Alto, CA (US)

(73) Assignee: Applied Materials, Inc., Santa Clara, CA (US)

( * ) Notice: Subject to any disclaimer, the term of this patent is extended or adjusted under 35 U.S.C. 154(b) by 518 days.

(21) Appl. No.: 12/717,358

(22) Filed: Mar. 4, 2010

(65) Prior Publication Data

US 2010/0227420 A1 Sep. 9, 2010

Related U.S. Application Data

(60) Provisional application No. 61/157,882, filed on Mar. 5, 2009.

(51) Int. Cl.
  *H01J 7/24* (2006.01)
(52) U.S. Cl. .................. 315/111.71; 315/311
(58) Field of Classification Search ............. 315/111.21, 315/111.71, 310–311
  See application file for complete search history.

(56) References Cited

U.S. PATENT DOCUMENTS

| | | | |
|---|---|---|---|
| 5,556,549 A * | 9/1996 | Patrick et al. | 216/61 |
| 6,174,450 B1 * | 1/2001 | Patrick et al. | 216/61 |
| 6,472,822 B1 | 10/2002 | Chen et al. | |
| 6,538,388 B2 | 3/2003 | Nakano et al. | |
| 6,806,437 B2 | 10/2004 | Oh | |
| 6,818,562 B2 | 11/2004 | Todorow et al. | |
| 6,875,366 B2 | 4/2005 | Sumiya et al. | |
| 7,375,038 B2 | 5/2008 | Kumar | |
| 7,435,392 B2 | 10/2008 | Oberbeck et al. | |
| 7,785,441 B2 | 8/2010 | Miyake et al. | |
| 7,967,944 B2 * | 6/2011 | Shannon et al. | 156/345.28 |
| 2001/0013504 A1 | 8/2001 | Imafuku et al. | |
| 2002/0041160 A1 * | 4/2002 | Barnes et al. | 315/111.21 |
| 2004/0226657 A1 | 11/2004 | Hoffman | |
| 2007/0247074 A1 * | 10/2007 | Paterson et al. | 315/111.21 |
| 2009/0284156 A1 | 11/2009 | Banna et al. | |

FOREIGN PATENT DOCUMENTS

JP 09-326383 A 12/1997

OTHER PUBLICATIONS

International Search Report and Written Opinion mailed Oct. 5, 2010 for PCT Application No. PCT/US2010/026237.
International Search Report and Written Opinion mailed Oct. 5, 2010 for PCT Application No. PCT/US2010/026291.

* cited by examiner

*Primary Examiner* — Jason M Crawford
(74) *Attorney, Agent, or Firm* — Moser Taboada; Alan Taboada (57) ABSTRACT

Embodiments of the present invention generally provide an inductively coupled plasma (ICP) reactor having a substrate RF bias that is capable of control of the RF phase difference between the ICP source (a first RF source) and the substrate bias (a second RF source) for plasma processing reactors used in the semiconductor industry. Control of the RF phase difference provides a powerful knob for fine process tuning. For example, control of the RF phase difference may be used to control one or more of average etch rate, etch rate uniformity, etch rate skew, critical dimension (CD) uniformity, and CD skew, CD range, self DC bias control, and chamber matching.

20 Claims, 8 Drawing Sheets

INDUCTIVELY COUPLED PLASMA REACTOR HAVING RF PHASE CONTROL AND METHODS OF USE THEREOF

CROSS-REFERENCE TO RELATED APPLICATIONS

This application claims benefit of U.S. provisional patent application Ser. No. 61/157,882, filed Mar. 5, 2009, which is herein incorporated by reference in its entirety.

FIELD

Embodiments of the present invention generally relate to semiconductor substrate processing systems and, more specifically, to semiconductor substrate processing systems that use inductively coupled plasmas.

BACKGROUND

Typically, plasma reactors use a radio frequency (RF) power source with a constant average power or voltage to excite a plasma in a vacuum chamber. Plasma reactors in which the RF power source is coupled to the process chamber inductively, also referred to as inductively coupled plasma (ICP) reactors, are widely used, for example, in silicon and metal etch applications. Most of these reactors have an additional RF generator coupled proximate the substrate in which plasma is coupled capacitively to the chamber. This additional RF generator is often referred to as a bias RF generator. Commonly used frequencies for both source and bias in ICP reactors for the semiconductor industry include 13.56 MHz.

The inventors have observed that, due to the nature of the coupling between the source and bias, such ICP reactors can almost independently control the plasma density via the source RF power and the ion energy via the bias RF power. However, some RF coupling between the two sources still takes place if the bias power is high enough to alter the plasma properties dictated mainly by the source. Such coupling could cause instabilities in the plasma due to slight differences in frequencies generated by the respective generators (for example, due to crystal variations). To overcome this deficiency, a common exciter may be used to force both generators to generate the same single frequency.

Unfortunately, however, the inventors have observed another potential problem that may arise due to phase misalignment of the signals produced by the respective generators. For example, although current commercial ICP reactors try to align both source and bias signals to have zero phase difference, the actual phase difference is rarely, if ever, zero. In addition, variations in the actual phase between source and bias generators naturally exist, causing chamber-to-chamber variation in their respective phase differences. Such differences in phase between chambers affects the ability to provide consistent processing amongst otherwise identical chambers.

Therefore, the inventors have provided improved inductively coupled plasma reactors as described herein.

SUMMARY

Embodiments of the present invention generally provide an inductively coupled plasma (ICP) reactor having a substrate RF bias that is capable of control of the RF phase difference between the ICP source (a first RF source) and the substrate bias (a second RF source) for plasma processing reactors used in the semiconductor industry. Control of the RF phase difference provides a powerful knob for fine process tuning. For example, control of the RF phase difference may advantageously be used to control processes, such as control over one or more of average etch rate, etch rate uniformity, etch rate skew, critical dimension (CD) uniformity, CD skew, CD range, self DC bias ($V_{DC}$) control, and the like. Control of the RF phase difference may further advantageously be used to provide for chamber matching between multiple plasma reactors (or any one or more plasma reactors with a desired baseline or standard plasma reactor).

In some embodiments, a matched plasma reactor is provided and may include a vacuum chamber; a first RF source for providing a first radio frequency (RF) signal at a first frequency that is inductively coupled to the vacuum chamber; and a second RF source for providing a second RF signal at the first frequency to an electrode disposed proximate to and beneath a substrate to be biased; wherein the first and second RF sources provide respective signals having a first phase difference that is preset to match a second phase difference of a second plasma reactor to which the plasma reactor is matched.

In some embodiments, a semiconductor processing system is provided and may include a first plasma reactor having an inductively coupled source RF generator and a bias RF generator that provide respective signals at a common frequency offset by a first phase difference; a second plasma reactor having an inductively coupled source RF generator and a bias RF generator that provide respective signals at a common frequency offset by a second intrinsic phase difference different than a first intrinsic phase difference of the source and bias RF generators of the first plasma reactor, the second plasma reactor further having a phase adjustment circuit for altering the second intrinsic phase difference to a desired second phase difference; and wherein the second phase difference is set to a predetermined offset from the first phase difference.

In some embodiments, a method of controlling the phase difference of inductively coupled plasma reactors is provided and may include providing a first plasma reactor including a source and a bias RF generator coupled thereto that provide RF signals at a common frequency and that have a first phase difference between the source and the bias RF generators; providing a second plasma reactor including a source and a bias RF generator coupled thereto that provide RF signals at a common frequency and that have a second phase difference between the source and the bias RF generators; comparing the first and second phase differences to calculate a third phase difference therebetween; and adjusting the third phase difference to equal a desired third phase difference.

In some embodiments, a method of controlling a process in an inductively coupled plasma reactor is provided and may include monitoring a parameter including at least one of $V_{DC}$, voltage, current, and/or phase between voltage and current as measured within the cathode, etch rate, etch rate uniformity, etch rate skew, critical dimension (CD) uniformity, CD skew, or CD range; and modifying a first intrinsic phase difference between a source RF generator and a bias RF generator that provide RF signals at a common frequency to the inductively coupled plasma reactor in response to the monitored parameter.

Other and further embodiments are provided in the detailed description, below.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

The above figures may be simplified for ease of understanding and are not drawn to scale.

DETAILED DESCRIPTION

Embodiments of the present invention generally provide an inductively coupled plasma (ICP) reactor having a substrate RF bias that is capable of control of the RF phase difference between the ICP source (a first RF source) and the substrate bias (a second RF source) for plasma processing reactors used in the semiconductor industry. In addition, embodiments of the present invention provide methods for controlling the RF phase difference between source and bias RF generators in a process chamber. Such RF phase control may be utilized in capacitively coupled plasma reactors as well as in the ICP plasma reactors described herein. Control of the RF phase difference provides a powerful knob for fine process tuning. The following aspects could be addressed by utilizing this knob: average etch rate, etch rate uniformity, etch rate skew (e.g., etch rate asymmetry), critical dimension (CD) uniformity, and CD skew (e.g., CD asymmetry), CD range, self DC bias control, and chamber matching.

Figure 1:
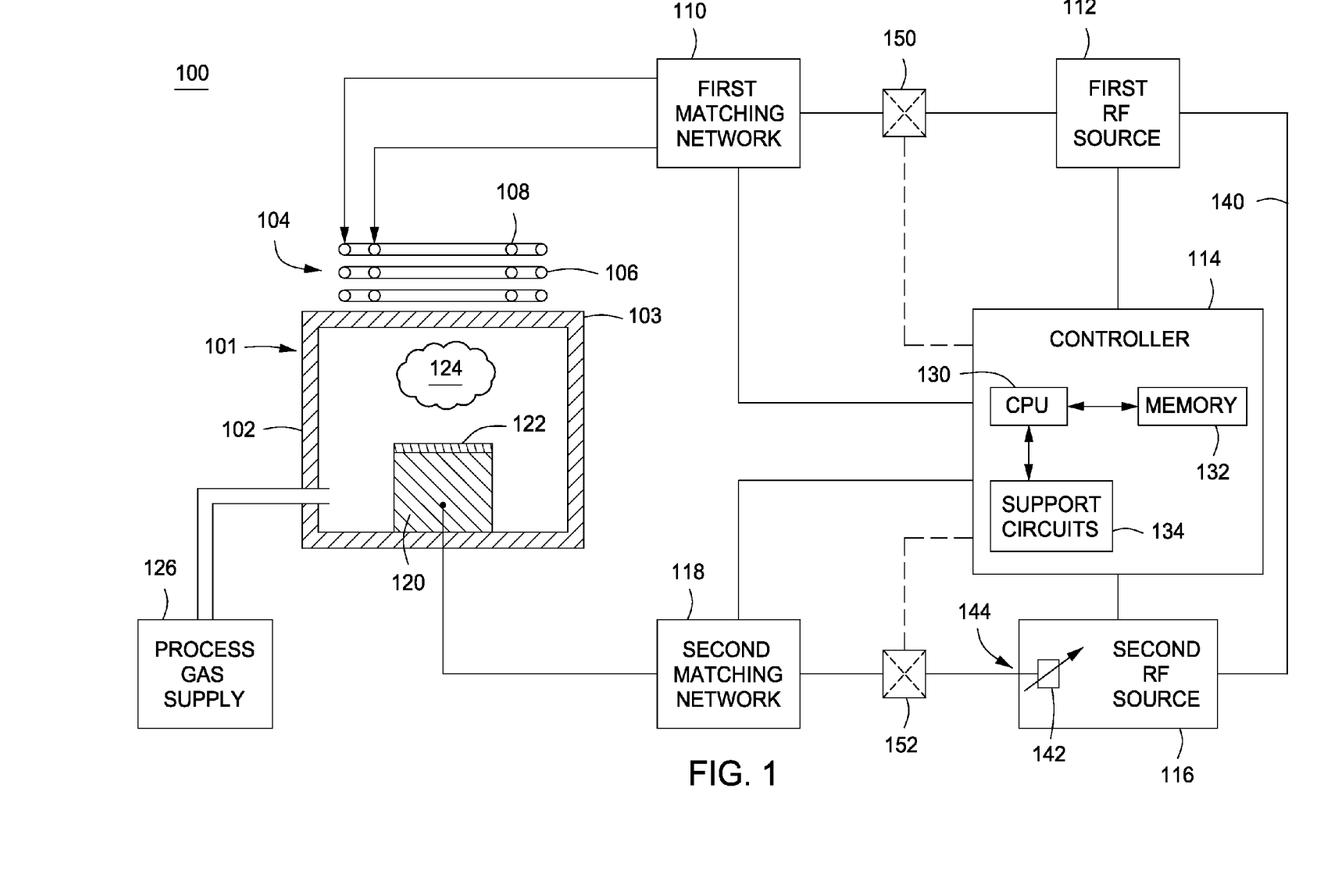
FIG. 1 is a schematic diagram of an inductively coupled plasma (ICP) reactor in accordance with some embodiments of the present invention.

FIG. 1 is an illustrative inductively coupled plasma (ICP) reactor 100 that in one embodiment is used for etching semiconductor wafers 122 (or other substrates and workpieces, such as photomasks). Other ICP reactors having other configurations may also be suitably modified and/or utilized, in accordance with the teachings provided herein. Alternatively, the exemplary ICP reactor disclosed in FIG. 1 may be modified with portions of other ICP reactors. Examples of ICP reactors that may be modified in accordance with the teachings disclosed herein include the ICP reactors disclosed in U.S. patent application Ser. No. 12/182,342, entitled, "FIELD ENHANCED INDUCTIVELY COUPLED PLASMA (FE-ICP) REACTOR," filed Jul. 30, 2008 by Valentin N. Todorow, et al., U.S. Provisional Patent Application Ser. No. 61/254,833, entitled, "INDUCTIVELY COUPLED PLASMA APPARATUS," filed Oct. 26, 2010 by Valentin N. Todorow, et al., and U.S. Provisional Patent Application Ser. No. 61/254,837, entitled, "DUAL MODE INDUCTIVELY COUPLED PLASMA WITH ADJUSTABLE PHASE COIL ASSEMBLY," filed Oct. 26, 2010 by Samer Banna, et al.

Although the disclosed embodiment of the invention is described in the context of an etch reactor and process, the invention is applicable to any form of plasma process that uses inductively coupled RF power and an RF bias source having the same frequency. Such reactors include plasma annealing reactors; plasma enhanced chemical vapor deposition reactors, physical vapor deposition reactors, plasma cleaning reactors, and the like. In addition, as noted above, the principles discussed herein may also be used to advantage in plasma reactors having capacitively coupled RF source generators.

This illustrative reactor 100 comprises a vacuum chamber 101, a process gas supply 126, a controller 114, a first RF power source 112, a second RF power source 116, a first matching network 110, and a second matching network 118.

The vacuum chamber 101 comprises a body 102 that contains a cathode pedestal 120 that forms a pedestal for the wafer 122. The roof or lid 103 of the process chamber has at least one antenna assembly 104 proximate the roof 103. The antenna assembly 104, in one embodiment of the invention, comprises a pair of antennas 106 and 108. Other embodiments of the invention may use one or more antennas or may use and electrode in lieu of an antenna to couple RF energy to a plasma. In this particular illustrative embodiment, the antennas 106 and 108 inductively couple energy to the process gas or gases supplied by the process gas supply 126 to the interior of the body 102. The RF energy supplied by the antennas 106 and 108 is inductively coupled to the process gases to form a plasma 124 in a reaction zone above the wafer 122. The reactive gases will etch the materials on the wafer 122.

In some embodiments, the power to the antenna assembly 104 ignites the plasma 124 and power coupled to the cathode pedestal 120 controls the plasma 124. As such, RF energy is coupled to both the antenna assembly 104 and the cathode pedestal 120. The first RF power source 112 supplies energy to a first matching network 110 that then couples energy to the antenna assembly 104. Similarly, a second RF power source 116 couples energy to a second matching network 118 that couples energy to the cathode pedestal 120. A controller 114 controls the timing of activating and deactivating the RF power sources 112 and 116 as well as tuning the first and second matching networks 110 and 118. The power coupled to the antenna assembly 104 known as the source power and the power coupled to the cathode pedestal 120 is known as the bias power. In embodiments of the invention, either the source power, the bias power, or both can be operated in either a continuous wave (CW) mode or a pulsed mode.

In some embodiments, a common exciter link 140 may be provided to couple the first and second RF sources 112, 116 to facilitate usage of a single RF frequency generated by one of the RF sources (the master) to be utilized by the other RF generator (the slave). Either RF source may be the lead, or master, RF generator, while the other generator follows, or is the slave. In some embodiments, the first RF source 112 is the master and the second RF source 116 is the slave. The first and second RF sources 112, 116 thus may provide respective signals having exactly the same RF frequency (as they are generated from a single source—the master generator). However, the respective signals will be offset in time, or phase, by some intrinsic amount. This is referred to herein as the intrinsic phase difference between the signals. The intrinsic phase difference between the first and second RF sources 112, 116 may further be adjusted by a phase adjustment, or delay circuit 142, which may be provided internally (e.g., within one of the generators) or externally (e.g., between the generators). In the embodiment illustrated in FIG. 1, the delay circuit 142 is provided in the slave RF source (the second RF source 116). The delay circuit may provide for a zero to 360 degree delay in the signal provided to the output 144 of the slave RF source, thereby facilitating control of the phase difference of the respective signals (e.g., the phase difference between the first and second RF source may be controlled or varied from the starting point of the intrinsic phase difference between the two RF sources through any increment up to and including 360 degrees). Thus, the first and second RF sources 112, 116 may be controlled to operate in perfect synchronization, or in any desired temporal offset, or phase difference.

In some embodiments, a first indicator device 150 and a second indicator device 152 may be used to determine the effectiveness of the ability of the matching networks 110, 118 to match to the plasma 124. In some embodiments, the indicator devices 150 and 152 monitor the reflective power that is reflected from the respective matching networks 110, 118. These devices can be integrated into the matching networks 110, 118, or power sources 112, 115. However, for descriptive purposes, they are shown here as being separate from the matching networks 110, 118. When reflected power is used as the indicator, the devices 150 and 152 are respectively coupled between the sources 112, 116 and the matching networks 110 and 118. To produce a signal indicative of reflected power, the devices 150 and 152 are directional couplers coupled to a RF detector such that the match effectiveness indicator signal is a voltage that represents the magnitude of the reflected power. A large reflected power is indicative of an unmatched situation. The signals produced by the devices 150 and 152 are coupled to the controller 114. In response to an indicator signal, the controller 114 produces a tuning signal (matching network control signal) that is coupled to the matching networks 110, 118. This signal is used to tune the capacitor or inductors in the matching networks 110, 118. The tuning process strives to minimize or achieve a particular level of, for example, reflected power as represented in the indicator signal.

The controller 114 comprises a central processing unit (CPU) 130, a memory 132 and support circuits 134. The controller 114 is coupled to various components of the reactor 100 to facilitate control of the etch process. The controller 114 regulates and monitors processing in the chamber via interfaces that can be broadly described as analog, digital, wire, wireless, optical, and fiber optic interfaces. To facilitate control of the chamber as described below, the CPU 130 may be one of any form of general purpose computer processor that can be used in an industrial setting for controlling various chambers and subprocessors. The memory 132 is coupled to the CPU 130. The memory 132, or a computer readable medium, may be one or more readily available memory devices such as random access memory, read only memory, floppy disk, hard disk, or any other form of digital storage either local or remote. The support circuits 134 are coupled to the CPU 130 for supporting the processor in a conventional manner. These circuits include cache, power supplies, clock circuits, input/output circuitry and related subsystems, and the like.

Process instructions, for example, etching or other process instructions, are generally stored in the memory 132 as a software routine typically known as a recipe. The software routine may also be stored and/or executed by a second CPU (not shown) that is remotely located from the hardware being controlled by the CPU 130. The software routine, when executed by CPU 130, transforms the general purpose computer into a specific purpose computer (controller) 114 that controls the system operation such as that for controlling the plasma during the etch process. Although the process of the present invention is discussed as being implemented as a software routine, some of the method steps that are disclosed therein may be performed in hardware as well as by the software controller. As such, the invention may be implemented in software as executed upon a computer system, and hardware as an application specific integrated circuit or other type of hardware implementation, or a combination of software and hardware.

Figure 2:
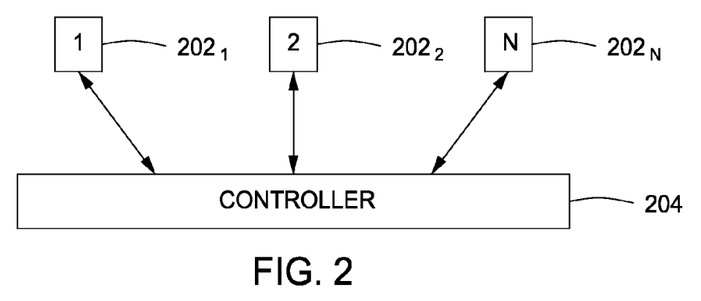
FIG. 2 is a schematic diagram of a semiconductor substrate processing system in accordance with some embodiments of the present invention.

In some embodiments, a semiconductor processing system may be provided having two or more similarly configured inductively coupled plasma reactors (e.g., configured similar to the inductively coupled plasma (ICP) reactor 100 described above) in a matched state. For example, a first plasma reactor $202_1$ may be matched with a second plasma reactor $202_2$ and optionally with up to N plasma reactors (represented by plasma reactors $202_N$). Each plasma reactor $202_{1-N}$ may be configured similarly to the inductively coupled plasma (ICP) reactor 100 described above. Accordingly, each plasma reactor $202_{1-N}$ will have an intrinsic phase difference between their respective first and second RF sources (e.g., between their respective source and bias RF generators). Each intrinsic phase difference may be the same or different, but will likely be different due to the natural variation in the manufacture and assembly of the respective systems.

Thus, any one of the plasma reactors $202_{1-N}$, for example plasma reactor $202_1$, may include a vacuum chamber, a first RF source for providing a first radio frequency (RF) signal at a first frequency that is inductively coupled to the vacuum chamber (e.g., a source RF generator) and a second RF source generator for providing a second RF signal at the first frequency to an electrode disposed proximate to and beneath a substrate to be biased (e.g., a bias RF generator). The first and second RF sources of the given reactor provide respective signals having a first phase difference that may be preset to match a second phase difference of a second plasma reactor to which the plasma reactor is matched.

The first phase difference may be preset by altering the intrinsic phase difference of between the first and second RF sources to match the second phase difference between the respective first and second RF sources of the second plasma reactor. The first phase difference may be altered with a delay circuit (such as the delay circuit 142 discussed above). The second phase difference of the second plasma reactor may be an intrinsic phase difference of that reactor, or may be some other phase difference to which the second plasma reactor is controlled. For example, the second phase difference may be altered from the intrinsic phase difference of the second plasma reactor in order to match a remote plasma reactor, match an empirically derived or modeled phase difference of a baseline or standard plasma reactor, provide process control, compensate for process drift, or otherwise provide a desired process result in accordance with the methods described below. As such, two or more plasma reactors may be matched to a remote plasma reactor, a predetermined phase difference of a baseline plasma reactor, or to each other. In addition, the "match" of the two or more plasma reactors may be based upon some other metric that can be controlled via phase control, such as self bias $V_{DC}$ or other parameters as discussed below.

In some embodiments, a controller 204 may optionally be provided and configured to receive a first input representing a first intrinsic phase difference between the first and second RF sources of a first plasma reactor, and a second input representing a second intrinsic phase difference between the first and second RF sources of a second plasma reactor. The controller 204 is further configured to calculate a phase offset between the first intrinsic phase difference and the second intrinsic phase difference. Alternatively, the controller may be configured to receive an input representing a phase offset, for example, that is calculated in a different controller or manually.

The controller 204 may be similar to controller 114 described above and may be a controller of a plasma reactor or may be a separate controller that is also coupled to the plasma reactor. The controller 204 may be configured to receive the first and second inputs, or the phase offset input, in any suitable manner, such as manually entering data, automated collection and input of the data inputs, or combinations thereof.

In some embodiments, the controller 204 is further configured to control a delay circuit in the second plasma reactor to apply the phase offset to the second intrinsic phase difference to create a phase difference that is equal to the first intrinsic phase difference. Alternatively, two or more of the plasma reactors may have respective phase offsets applied to modify their respective intrinsic phase differences to match a desired phase offset. As such, one or more (including all) plasma reactors that are to be matched may have phase differences that are matched to an existing intrinsic phase difference of any one of the plasma reactors or to some other desired phase difference. In some embodiments, the phase difference of one or more (including all) of the plasma reactors that are to be matched may be controlled to different values in order to match some other parameter, such as self bias $V_{DC}$ or other parameters that may be controlled via the phase control, as discussed below.

Although discussed above as a separate controller, each individual controller in each plasma reactor $202_{1-N}$ may be configured as discussed above without the need for a separate controller 204. As such, any one or more of the capabilities of the controller 204 may be provided in a controller of any one or more of the plasma reactors $202_{1-N}$.

In some embodiments, a method of controlling the phase difference of inductively coupled plasma reactors may include providing a first plasma reactor including a source and a bias RF generator coupled thereto that provide RF signals at a common frequency. A first phase difference exists between the source and the bias RF generators. The first phase difference may be an intrinsic phase difference or some other phase difference. A second plasma reactor is provided including a source and a bias RF generator coupled thereto that provide RF signals at a common frequency. A second phase difference exists between the source and the bias RF generators. The second phase difference may be an intrinsic phase difference or some other phase difference. The first and second phase differences may be compared to calculate a third phase difference between the first and second phase differences. The third phase difference may be adjusted to equal a desired third phase difference. The third phase difference may be adjusted by controlling one or more of the first phase difference or the second phase difference. This same methodology can apply to controlling the relative phase differences of more than two plasma reactors as well.

Figure 3:
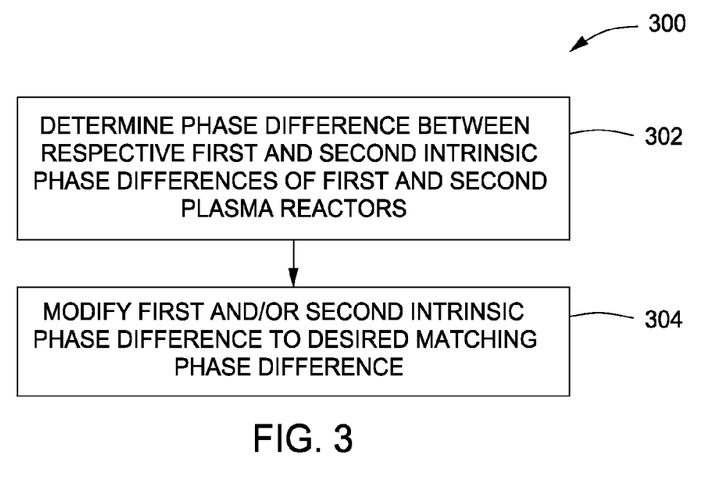
FIG. 3 is a flow chart depicting a process for matching the phase difference of inductively coupled plasma reactors in accordance with some embodiments of the present invention.

FIG. 3 depicts a flow chart of a method 300 of matching plasma reactors in accordance with some embodiments of the present invention and which may be utilized in accordance with the plasma reactors discussed above. The method 300 generally begins at 302, where a phase difference between respective first and second intrinsic phase differences of first and second plasma reactors is determined.

Figure 4:
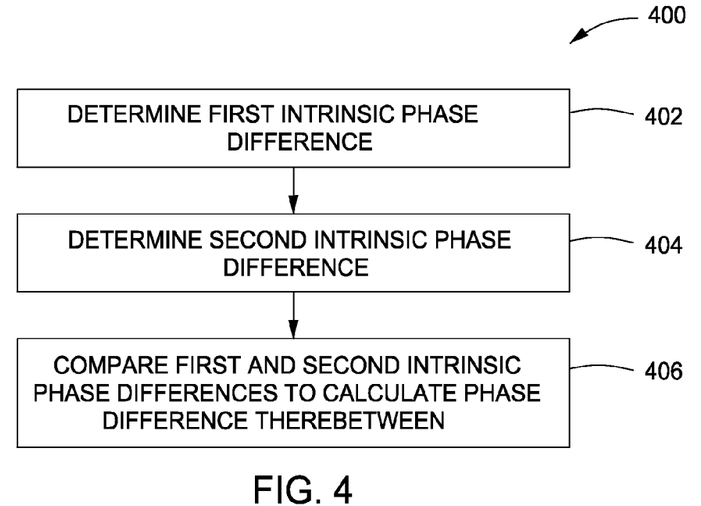
FIG. 4 is a flow chart depicting a process for determining the phase difference between inductively coupled plasma reactors in accordance with some embodiments of the present invention.

The phase difference may be determined in various ways. For example, in some embodiments, and as depicted in the method 400 of FIG. 4, the phase difference can calculated by directly measuring the intrinsic phase difference of the RF sources coupled to each plasma reactor (referred to as direct measurement). For example, the method 400 begins at 402 where a first intrinsic phase difference is determined. The first intrinsic phase difference can be determined, for example, by connecting the respective outputs of the first and second RF sources to an oscilloscope or other device that can directly measure the phase of each of the first and second RF sources and comparing the measurements to obtain the phase difference. This may be repeated with the second plasma reactor to determine the second intrinsic phase difference, as shown at 404. Additional intrinsic phase differences may be measured (not shown) where additional plasma reactors are desired to be matched. Next, at 406, the first and second intrinsic phase differences (and other intrinsic phase differences, if any) may be compared to calculate the phase difference therebetween.

Figure 5:
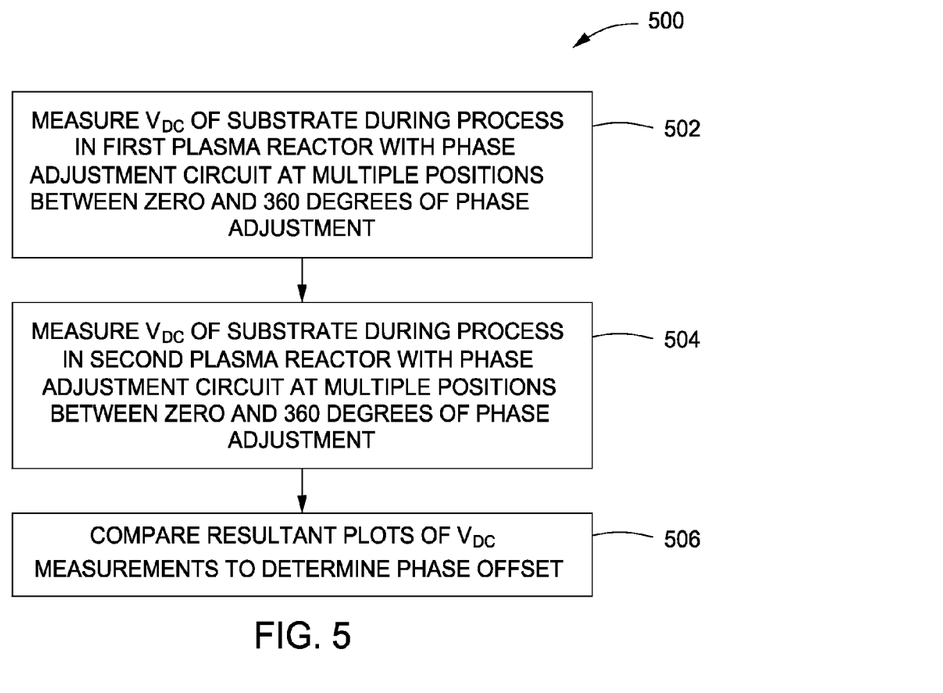
FIG. 5 is a flow chart depicting a process for determining the phase difference between inductively coupled plasma reactors in accordance with some embodiments of the present invention.

Alternatively, the phase difference may be determined by plotting a characteristic that correlates with the phase for each of the plasma reactors to be matched and then determining the phase difference by comparing the plots (referred to as empirical determination). For example, FIG. 5 depicts a flow chart of a method 500 for determining a phase difference between two or more plasma reactors suitable for use (amongst other uses) at 302 in the method 300, discussed above. The method 500 is further described with reference to FIG. 6, which depicts a graph of phase difference versus DC volts measured on a substrate ($V_{DC}$). Although $V_{DC}$ measured on the substrate is discussed herein with respect to FIGS. 5-6 (and in other locations as well), other equivalent parameters may also be utilized. For example, $V_{DC}$ can be evaluated via voltage, current, and/or phase between voltage and current as measured within the cathode. For example, the voltage, current, and the phase between the voltage and current at the cathode end are measured via z-scan (an impedance measurement device) located within the cathode or within the bias RF matching network. Such parameters may be used to evaluate/calculate the $V_{DC}$ at the wafer level, if not measured directly. As such, the phase difference may be determined, monitored, and/or controlled in response to $V_{DC}$ or other equivalent parameter (or to control the value of $V_{DC}$ or other equivalent parameter).

The method 500 generally begins at 502, where the $V_{DC}$ of a substrate may be measured during a process in the first plasma reactor over a plurality of positions of the phase adjustment circuit (e.g., 142) ranging between zero and 360 degrees of phase adjustment. The process may be any process including a test process or a production process. The $V_{DC}$ of the substrate may be measured in any suitable manner. In some embodiments, the $V_{DC}$ of the substrate may be calculated based upon current, voltage, and phase measurements in the bias match circuit (e.g., the second matching network 118, as depicted in FIG. 1). The plurality of positions of the phase adjustment circuit (and the number of measurements) can be any amount for obtaining a suitable graph. For example, moving at increments of 1 degree will result in 360 measurements, however, moving in larger increments such as 5, 10, 15, or 20 degrees, or some other amount will reduce the number of measurements necessary and may provide suitable data for obtaining a graph suitable for use as described herein.

Figure 6:
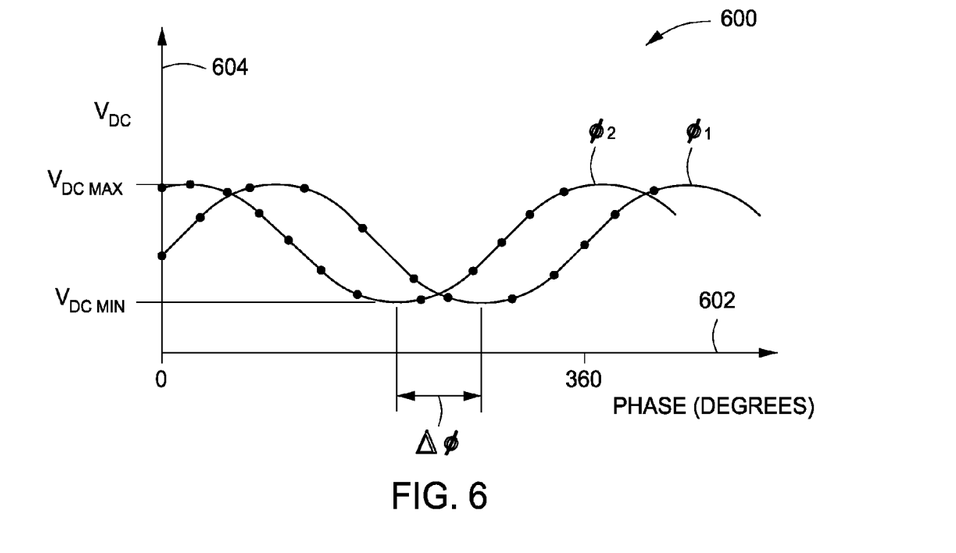
FIG. 6 is a graph plotting $V_{DC}$ versus phase difference.

For example, FIG. 6 depicts a chart 600 of a first phase difference ($\phi_1$) and a second phase difference ($\phi_2$) showing self DC bias ($V_{DC}$) (axis 604) as a function of phase (axis 602). The phase on axis 602 represents the position of the phase adjustment circuit of each respective plasma reactor, and not the intrinsic phase difference of the first and second RF sources of any plasma reactor. As can be seen from the chart 600, $V_{DC}$ measurements can be made at a plurality phase differences between zero and 360 degrees (e.g., positions of the phase adjustment circuit).

Next, at 504, this process may be repeated to measure the $V_{DC}$ of a substrate during the same process performed in a second plasma reactor with its phase adjustment circuit positioned at multiple locations between zero and 360 degrees of phase adjustment to obtain a similar plot (e.g., $\phi_2$ depicted in FIG. 6).

At 506, the resultant plots of $V_{DC}$ measurements may be compared to determine the phase offset between the first and second plasma reactors. For example, as shown in FIG. 6, the distance between corresponding points of the graphs of $\phi_1$ and $\phi_2$ may be measured on axis 602 to obtain the phase difference in degrees.

Returning to FIG. 3, upon determining the phase difference between the first and second intrinsic phase differences of the first and second plasma reactors, the first and/or the second intrinsic phase difference may be modified to obtain a desired matching phase difference at 304. The desired matching phase difference may be equal to the first or second intrinsic phase difference (e.g., adjust the phase difference of one or more plasma reactors to match the phase difference of another plasma reactor) or the desired matching phase difference may be some other phase difference (e.g., the phase difference of all plasma reactors may be adjusted to match at some different phase). As used herein, matching of two or more plasma reactors includes matching the phase difference between the two or more plasma reactors or controlling the phase difference of one or more of the two or more plasma reactors in order to match process results, for example, by matching some other measured parameter, such as $V_{DC}$ on the substrate, the voltage, current, and/or phase within the cathode, or the like.

Figure 7:
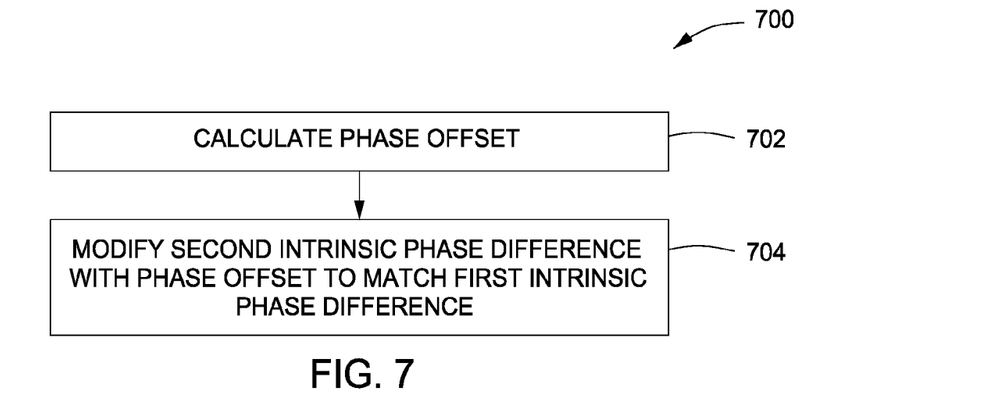
FIG. 7 is a flow chart depicting a process for matching the phase difference of inductively coupled plasma reactors in accordance with some embodiments of the present invention.

For example, FIG. 7 depicts a method 700 for matching the phase of two or more plasma reactors in accordance with some embodiments of the present invention and suitable for use in connection with the method 300 at 304. The method 700 begins at 702 where the phase offset is calculated. The phase offset may be calculated in any of the ways discussed above (e.g., by direct measurement as discussed with respect to FIG. 4, or by empirical determination as discussed with respect to FIGS. 5-6).

Next, at 704, the second intrinsic phase difference between the first and second RF sources of the second plasma reactor may be altered with the calculated phase offset to match the first intrinsic phase difference of the first plasma reactor. Thus, the phase difference between the first and second plasma reactors (and other plasma reactors) may be precisely matched in terms of phase.

Figure 8:
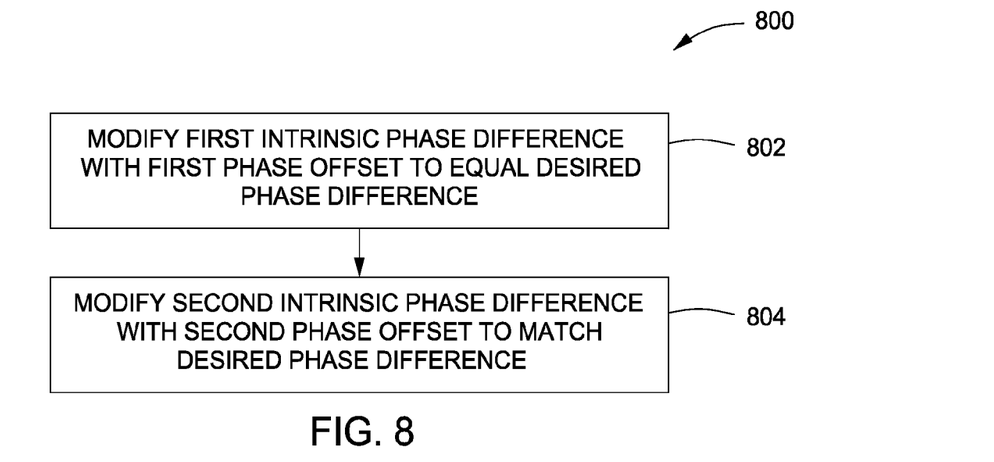
FIG. 8 is a flow chart depicting a process for matching the phase difference of inductively coupled plasma reactors in accordance with some embodiments of the present invention.

Alternatively, instead of matching to an intrinsic phase difference present in one plasma reactor, each plasma reactor may have its phase difference modified to match some other desired phase difference. For example, as shown in method 800 in FIG. 8, a first intrinsic phase difference of a first plasma reactor may be modified with a first phase offset to equal a desired phase difference, as shown at 802. Next, at 804, a second intrinsic phase difference of a second plasma reactor may be modified with a second phase offset to match the desired phase difference provided by the first plasma reactor. Thus, the respective phase differences are matched, but by modifying the intrinsic phase difference of all plasma reactors to some other desired level.

Each of the above methods relate to matching the phase difference in inductively coupled plasma reactors to each other. The inventors have developed mew apparatus and methods for more precisely matching the phase difference of multiple plasma reactors. In addition, the inventors have discovered that the phase difference in a plasma reactor has an effect on various processing parameters and results, and further that matching the phase difference more precisely than conventional systems currently allow advantageously provides improved levels of process control.

For example, the inventors have discovered that control over the phase difference between the first and second RF sources (e.g., the source and bias RF sources) in an inductively coupled plasma reactor such as the reactor 100 discussed above, facilitates control over process parameters such as $V_{DC}$, or other equivalent parameters such as voltage, current, and/or phase within the cathode, and process results such as etch rate, etch rate uniformity, etch rate skew (e.g., asymmetry of etch rate distribution), critical dimension (CD) uniformity, and CD skew, CD range, and the like.

As such, control over the phase difference of a given plasma reactor facilitates control over the processing performance in that reactor. Such control may further facilitate compensating for slight process drift and extending mean time between cleaning or maintenance of the plasma reactor. Moreover, such control facilitates matching of multiple plasma reactors, which facilitates more uniform processing from tool to tool.

Figure 9:
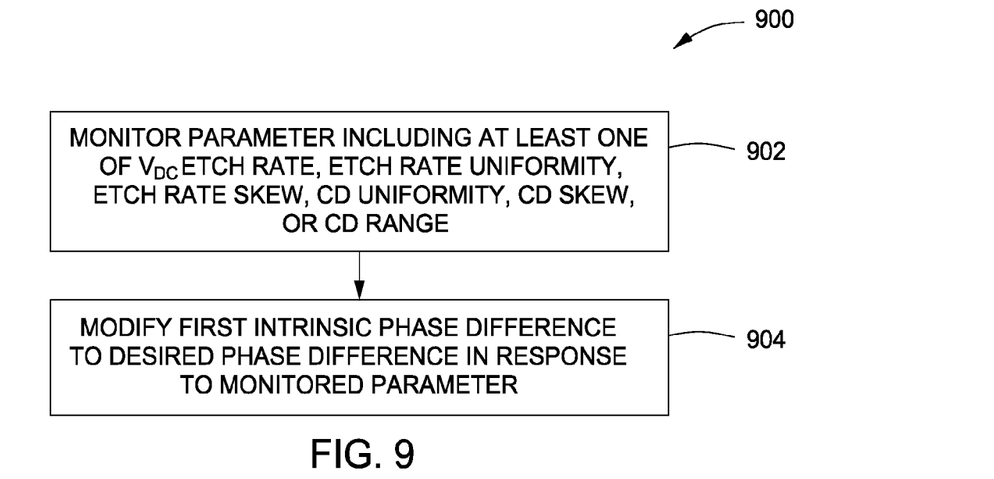
FIG. 9 is a flow chart depicting a process for controlling a process in an inductively coupled plasma reactor in accordance with some embodiments of the present invention.

For example, FIG. 9 depicts a flow chart of a method 900 for processing substrates in accordance with some embodiments of the present invention. The method 900 generally begins at 902 where a parameter including at least one of $V_{DC}$ on a substrate, voltage, current, and/or phase between voltage and current as measured within the cathode, etch rate, etch rate uniformity, etch rate skew, critical dimension (CD) uniformity, and CD skew, or CD range, of a process is monitored. Such monitoring may occur during processing or by measuring the substrate upon completion of processing (either in situ or in an external metrology station). Next at 904, a first intrinsic phase difference between the first and second RF sources of the plasma reactor may be modified to a desired phase difference in response to monitored parameter. Alternatively, if the first plasma reactor is already operating with a modified phase difference different than the first intrinsic phase difference, then the modified phase difference may be further modified or controlled as discussed above to provide a second modified phase difference in response to the monitored parameter.

As self DC bias is one of the main parameters characterizing the ion energy bombarding the wafer, having accurate control of DC values by varying the phase in a given chamber provides improved performance as compared to processing equipment and techniques not providing DC control. DC bias control via phase control further provides such improved performance without the need to vary RF power or other process parameters. The apparatus and methods disclosed herein thus advantageously provide for such DC bias control within a range of self DC bias variation for a given process versus the phase difference. For example, looking at FIG. 6, it can be seen that the $V_{DC}$ measured during a particular process varies according to the phase difference between the source and bias RF sources (e.g., the first and second RF sources 112, 116). Accordingly, be controlling the phase difference using the phase control circuit (e.g., phase control circuit 142), the resultant $V_{DC}$ during processing can be controlled within a range between $V_{DC\ MAX}$ and $V_{DC\ MIN}$. As such, for a given process you can pick the $V_{DC}$ bias value within the range and simply adjust the phase to get this value. The resultant $V_{DC}$ can be controlled to match the $V_{DC}$ value provided in another plasma reactor or can be controlled by itself to control processing in a particular plasma reactor.

Figure 15:
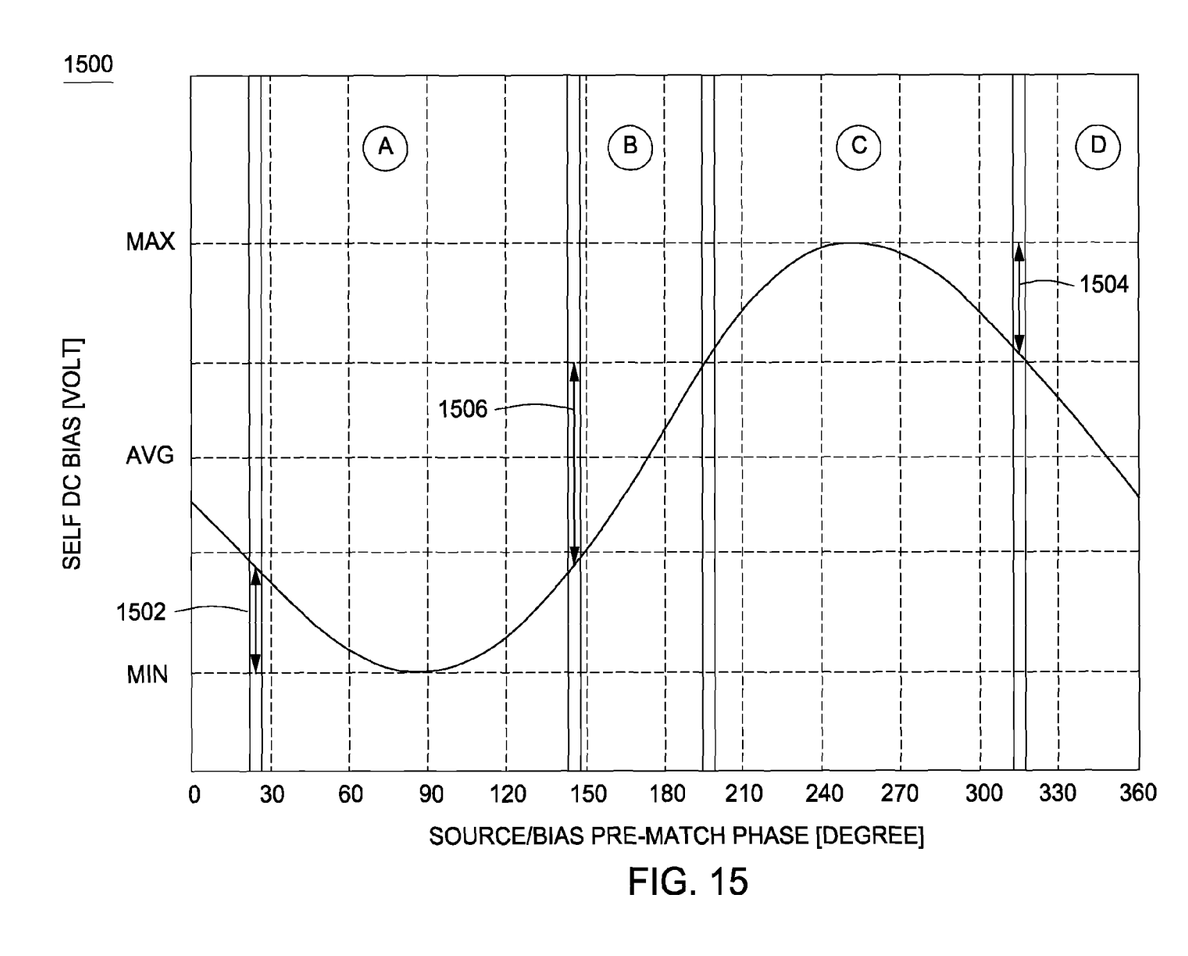
FIG. 15 depicts an illustrative plot of self DC bias ($V_{DC}$) as a function of phase.

FIG. 15 depicts an illustrative plot 1500 of $V_{DC}$ bias versus phase showing four arbitrary regions of control (labeled A-D). The regions A-B represent four different regions of phase control. In regions A and C, the plasma reactor is operating near the minima and maxima of the $V_{DC}$ bias. In FIG. 15, the regions A and C are arbitrarily bounded by being within about 5 percent of the minima and maxima, respectively (shown by arrows 1502 and 1504). Accordingly, in regions A and C, a change of over 100 degrees of phase can be tolerated with less than or equal to about 5 percent $V_{DC}$ bias variation. In regions B and D, the plasma reactor is operating about the average of the $V_{DC}$ bias. In FIG. 15, the regions B and D are arbitrarily bounded by being within about plus or minus 5 percent of the $V_{DC}$ bias average (shown by arrow 1506). Accordingly, in regions B and D, a range of only about 25 degrees of phase can be tolerated with about 5 percent $V_{DC}$ bias variation about the average. These ranges and boundaries are arbitrarily selected for illustration and are not intended to be limiting of the scope of the invention. Operating at these different regions facilitates determining how tight the phase matching between multiple chambers needs to be in order to ensure matched or within tight tolerances of on-wafer performance among the chambers.

The inventors have discovered that control of other process results are similarly correlated with phase difference. As such, similar control methods can be utilized to control etch rate, etch rate uniformity, etch rate skew, critical dimension (CD) uniformity, and CD skew, or CD range, using phase difference control as described herein.

For example, a method of controlling a process in an inductively coupled plasma reactor may include monitoring a parameter including at least one of $V_{DC}$, etch rate, etch rate uniformity, etch rate skew, critical dimension (CD) uniformity, CD skew, or CD range. A first phase difference between a source RF generator and a bias RF generator that provide RF signals at a common frequency to the inductively coupled plasma reactor may be controlled in response to the monitored parameter in order to control the desired process result.

Figure 10:
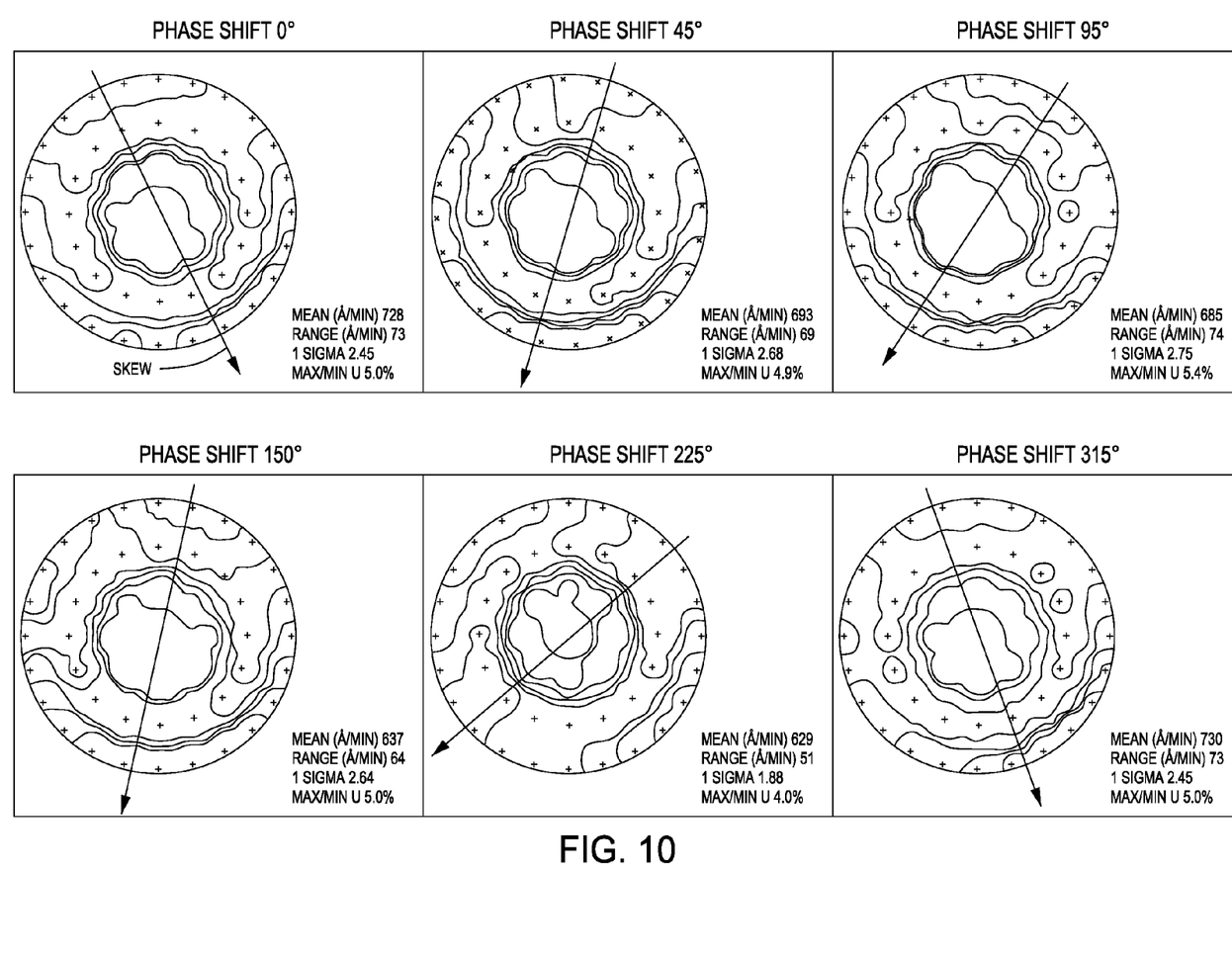
FIG. 10 depicts an exemplary series of plots of etch rates on a substrate for an etch process in accordance with some embodiments of the present invention.

For example, FIG. 10 shows an exemplary series of plots of etch rates on a substrate for an etch process. For this example, the process was an etch of a blanket silicon nitride wafer (200 mm) utilizing 250 sccm $CHF_3$ and 300 sccm $CF_4$ as an etchant, 500 W of source RF power (13.56 MHz), 125 W of bias RF power (13.56 MHz), at 30 mTorr chamber pressure. At each phase difference, a different pattern of etch rates, average etch rates, range of etch rates, and etch rate skew was observed. Selection of a desired phase difference facilitates obtaining desired process results amongst these variables within the observed range.

Figure 11:
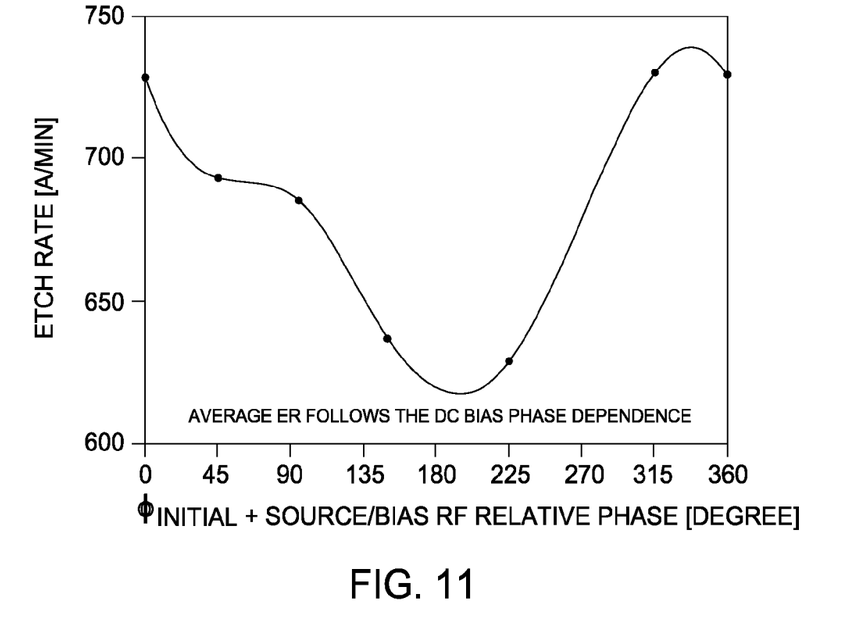
FIG. 11 depicts a plot of average etch rate variation as a function of the phase difference for an etch process in accordance with some embodiments of the present invention.
Figure 12:
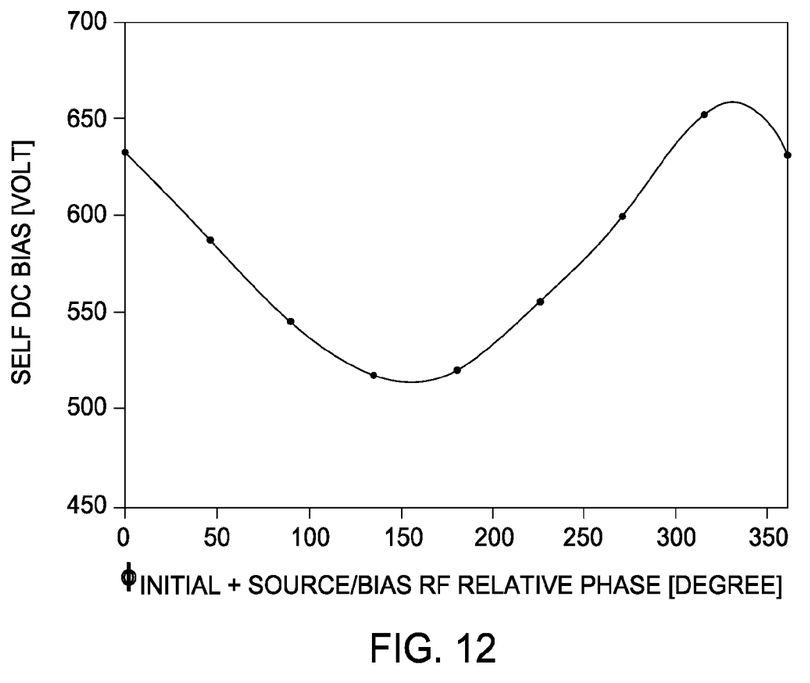
FIG. 12 depicts a plot of self DC bias ($V_{DC}$) as a function of the phase difference for an etch process in accordance with some embodiments of the present invention.

FIG. 11 depicts an illustrative plot of average etch rate variation as a function of the phase difference. FIG. 12 depicts an illustrative plot of self DC bias ($V_{DC}$) as a function of the phase difference. As can be seen by comparing the two plots, the average etch rate follows the self DC bias ($V_{DC}$) dependence upon the phase difference. FIGS. 11 and 12 are only representative plots and some variation in the etch rate or self DC bias ($V_{DC}$) curves might take place. In most cases, the etch rate curve will follow the $V_{DC}$ curve, e.g., they will be sinusoidal. In addition, although only etch rate and $V_{DC}$ are shown graphed in FIGS. 11 and 12, the inventors have discovered phase control may similarly be correlated to equivalent RF parameters such as current, voltage, and or voltage/current phase as measured via the cathode. Accordingly, the phase control methodologies disclosed herein may also similarly be used while monitoring such equivalent RF parameters, such as current, voltage, or voltage/current phase as measured via the cathode.

Figure 13:
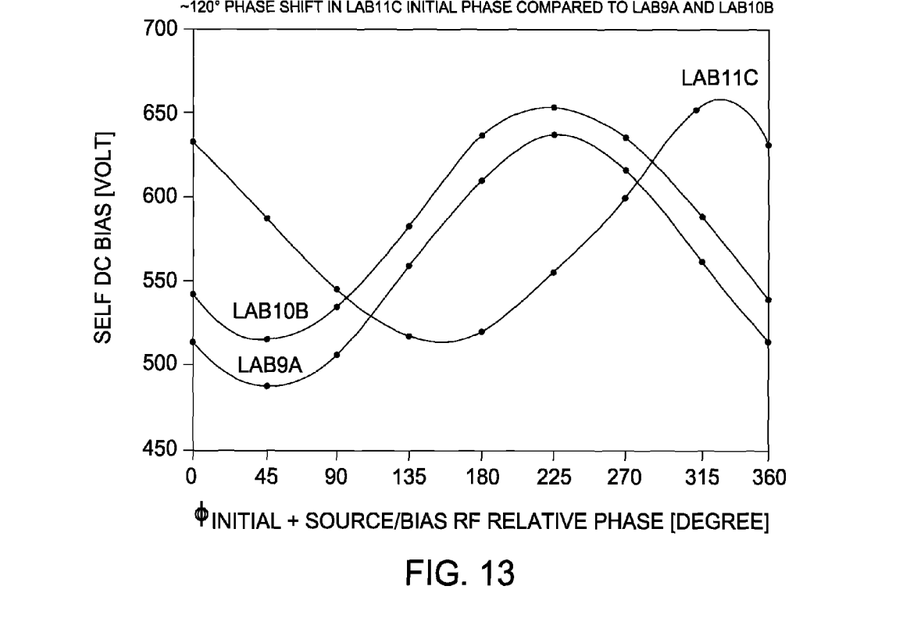
FIG. 13 depicts a plot of self DC bias ($V_{DC}$) as a function of the phase difference for three different ICP reactors for an etch process in accordance with some embodiments of the present invention.
Figure 14:
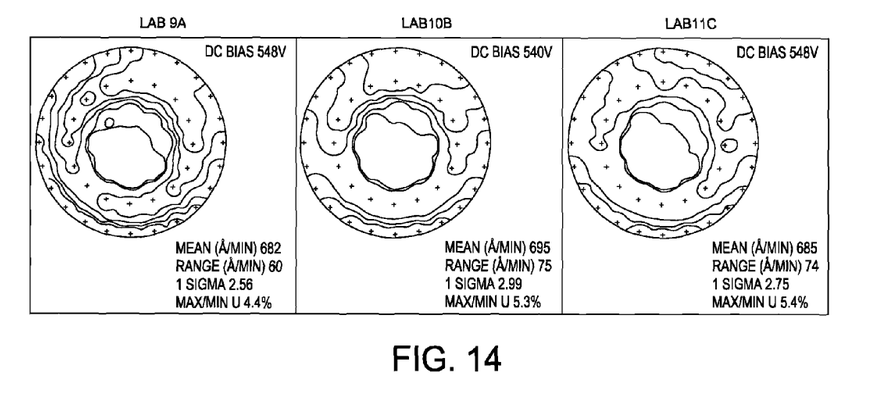
FIG. 14 depicts a an exemplary series of plots of etch rates on a substrate for an etch process in accordance with some embodiments of the present invention.

FIG. 13 depicts a plot of self DC bias ($V_{DC}$) as a function of the phase difference for three different ICP reactors. As can be seen from the overlap, each chamber may be matched to the other in terms of phase difference, or in terms of self DC bias ($V_{DC}$). For example, FIG. 14 depicts a an exemplary series of plots of etch rates on a substrate for an etch process similar to that described in FIG. 10 for the three ICP reactors of FIG. 13. The plots reveal that similar etch rates, average etch rates, range of etch rates, and etch rate skew patterns can be obtained in different process chambers by controlling the $V_{DC}$ bias in each respective reactor.

For each of the above methods for matching the phase difference in inductively coupled plasma reactors to each other, the plasma reactors may be part of a plurality of plasma reactors located in a single site (for example, in a semiconductor fabrication site) or in multiple sites (such as in multiple fabrication sites, or one or more fabrication sites and a laboratory or the like). As such, the plasma reactors may be matched locally within a site, or globally (e.g., remotely) between any locations in the world.

While the foregoing is directed to embodiments of the present invention, other and further embodiments of the invention may be devised without departing from the basic scope thereof.

We claim:

1. A matched plasma reactor, comprising:
a vacuum chamber;
a first RF source for providing a first radio frequency (RF) signal at a first frequency that is inductively coupled to the vacuum chamber; and
a second RF source for providing a second RF signal at the first frequency to an electrode disposed proximate to and beneath a substrate to be biased;
wherein the first and second RF sources provide respective signals having a first phase difference that is preset to match a second phase difference of a second plasma reactor to which the plasma reactor is matched.

2. A semiconductor processing system, comprising:
a first plasma reactor having an inductively coupled source RF generator and a bias RF generator that provide respective signals at a common frequency offset by a first phase difference;
a second plasma reactor having an inductively coupled source RF generator and a bias RF generator that provide respective signals at a common frequency offset by a second intrinsic phase difference different than a first intrinsic phase difference of the source and bias RF generators of the first plasma reactor, the second plasma reactor further having a phase adjustment circuit for altering the second intrinsic phase difference to a desired second phase difference; and
wherein the second phase difference is set to a predetermined offset from the first phase difference.

3. The semiconductor processing system of claim 2, wherein the second phase difference is preconfigured via the phase adjustment circuit to correspond with the first phase difference.

4. The semiconductor processing system of claim 2, further comprising:
a controller configured to receive a first input representing the first phase difference and a second input representing the second phase difference and to calculate a phase offset between the first phase difference and the second phase difference.

5. The semiconductor processing system of claim 2, further comprising:
a controller configured to control the phase adjustment circuit to apply a phase offset to the second phase difference to cause the second phase difference to equal the first phase difference.

6. The semiconductor processing system of claim 5, wherein the first phase difference is equal to the first intrinsic phase difference.

7. The semiconductor processing system of claim 5, wherein the first phase difference is different than the first intrinsic phase difference.

8. A method of controlling the phase difference of inductively coupled plasma reactors, comprising:
providing a first plasma reactor including a source and a bias RF generator coupled thereto that provide RF signals at a common frequency and that have a first phase difference between the source and the bias RF generators;
providing a second plasma reactor including a source and a bias RF generator coupled thereto that provide RF signals at a common frequency and that have a second phase difference between the source and the bias RF generators;
comparing the first and second phase differences to calculate a third phase difference therebetween; and
adjusting the third phase difference to equal a desired third phase difference.

9. The method of claim 8, further comprising:
determining a first intrinsic phase difference between the source and the bias RF generators of the first plasma reactor;
determining a second intrinsic phase difference between the source and the bias RF generators of the second plasma reactor; and
adjusting the second intrinsic phase difference of the second plasma reactor to obtain the desired third phase difference.

10. The method of claim 9, wherein the desired third phase difference is about zero.

11. The method of claim 10, further comprising:
adjusting a phase difference of the first plasma reactor to a value different than the first intrinsic phase difference.

12. The method of claim 9, wherein the desired third phase difference is a non-zero value.

13. The method of claim 12, further comprising:
adjusting a phase difference of the first plasma reactor to a value different than the first intrinsic phase difference.

14. The method of claim 9, wherein:
determining the first intrinsic phase offset comprises measuring $V_{DC}$ of a substrate during a process in a first plasma reactor with a phase adjustment circuit at multiple positions between zero and 360 degrees of phase adjustment; and
determining the second intrinsic phase offset comprises measuring $V_{DC}$ of a substrate during a process in a second plasma reactor with a phase adjustment circuit at multiple positions between zero and 360 degrees of phase adjustment; and
calculating the third phase difference comprises comparing resultant plots of $V_{DC}$ measurements to determine the third phase difference between the first and the second plasma reactors.

15. The method of claim 8, wherein the first plasma reactor is disposed in a location remote from the second plasma reactor.

16. A method of controlling a process in an inductively coupled plasma reactor, comprising:
monitoring a parameter including at least one of $V_{DC}$, voltage, current, and/or voltage/current phase as measured via the cathode, etch rate, etch rate uniformity, etch rate skew, critical dimension (CD) uniformity, CD skew, or CD range; and
modifying a first phase difference between a source RF generator and a bias RF generator that provide RF signals at a common frequency to the inductively coupled plasma reactor in response to the monitored parameter.

17. The method of claim 16, further comprising:
modifying the first phase difference to equal a predetermined desired phase difference.

18. The method of claim 16, further comprising:
modifying the first phase difference in accordance with a predetermined correlation between the phase difference between the source RF generator and the bias RF generator and the parameter being monitored.

19. The method of claim 18, wherein the parameter being monitored is $V_{DC}$ and wherein the predetermined correlation between the phase difference and the parameter being monitored is further correlated to a desired process result.

20. The method of claim 16, further comprising:
continually or periodically monitoring the parameter over time and modifying the first phase difference in response to the monitored parameter to compensate for process drift.

* * * * *